(12) United States Patent
Cho et al.

(10) Patent No.: US 9,306,551 B2
(45) Date of Patent: Apr. 5, 2016

(54) INTERPOLATOR AND INTERPOLATION CELLS WITH NON-UNIFORM DRIVING CAPABILITIES THEREIN

(71) Applicant: MediaTek Inc., Hsin-Chu (TW)

(72) Inventors: Yi-Hsien Cho, Zhubei (TW); Kuan-Hua Chao, Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 146 days.

(21) Appl. No.: 13/747,012

(22) Filed: Jan. 22, 2013

(65) Prior Publication Data

US 2014/0203858 A1  Jul. 24, 2014

(51) Int. Cl.
  *H03K 3/00* (2006.01)
  *H03K 5/13* (2014.01)
  *H03K 5/134* (2014.01)

(52) U.S. Cl.
  CPC .............. *H03K 5/133* (2013.01); *H03K 5/134* (2014.07)

(58) Field of Classification Search
  USPC ........................................................ 327/112
  See application file for complete search history.

(56) References Cited

U.S. PATENT DOCUMENTS

| | | | |
|---|---|---|---|
| 6,169,436 B1* | 1/2001 | Marbot | 327/270 |
| 6,366,149 B1* | 4/2002 | Lee et al. | 327/276 |
| 6,404,260 B1* | 6/2002 | Cruz-Albrecht | 327/299 |
| 6,791,388 B2 | 9/2004 | Buchwald et al. | |
| 7,564,284 B2* | 7/2009 | Henzler et al. | 327/261 |
| 7,613,266 B1* | 11/2009 | Talbot | 375/371 |
| 7,894,260 B2* | 2/2011 | Lee et al. | 365/185.05 |
| 7,915,941 B1 | 3/2011 | Pan et al. | |
| 8,018,265 B1* | 9/2011 | Kim et al. | 327/231 |
| 2001/0033195 A1* | 10/2001 | Kanda et al. | 327/541 |
| 2010/0079180 A1* | 4/2010 | Kim et al. | 327/158 |

* cited by examiner

*Primary Examiner* — Lincoln Donovan
*Assistant Examiner* — Patrick Chen
(74) *Attorney, Agent, or Firm* — McClure, Qualey & Rodack, LLP

(57) ABSTRACT

An interpolator includes interpolation cells. Each interpolation cell includes a first driving unit and a second driving unit. The first driving unit includes a first pulling-up circuit for selectively coupling an output terminal to a high voltage, a first pulling-down circuit for selectively coupling the output terminal to a low voltage, and a pair of first switches for selectively enabling/disabling the first pulling-up circuit and the first pulling-down circuit. The second driving unit includes a second pulling-up circuit for selectively coupling the output terminal to the high voltage, a second pulling-down circuit for selectively coupling the output terminal to the low voltage, and a pair of second switches for selectively enabling/disabling the second pulling-up circuit and the second pulling-down circuit. Driving capabilities of the first and second pulling-up circuits are not all equal, and/or driving capabilities of the first and second pulling-down circuits are not all equal.

16 Claims, 9 Drawing Sheets

INTERPOLATOR AND INTERPOLATION CELLS WITH NON-UNIFORM DRIVING CAPABILITIES THEREIN

BACKGROUND OF THE INVENTION

1. Field of the Invention

The disclosure generally relates to an interpolator, and more particularly, to an interpolator for providing an interpolation signal having a controllable phase between a leading phase of a first signal and a lagging phase of a second signal.

2. Description of the Related Art

An interpolator is configured to generate an interpolation signal according to two input signals having different phases. For example, a first input signal has a leading phase, and a second input signal has a lagging phase. The interpolator generates more phases out of the phases of the first and second input signals.

However, a conventional interpolator often faces a problem of signal nonlinearity, and the performance of the interpolator is degraded. Accordingly, there is a need to design a novel interpolator for solving the problem of signal nonlinearity.

BRIEF SUMMARY OF THE INVENTION

In one exemplary embodiment, the disclosure is directed to an interpolator, comprising: a plurality of interpolation cells, each comprising: a first driving unit, comprising: a first pulling-up circuit, for selectively coupling an output terminal to a high voltage according to a first input signal, wherein the output terminal is used to output an interpolation signal; a first pulling-down circuit, for selectively coupling the output terminal to a low voltage according to the first input signal; and a pair of first switches, for selectively enabling/disabling the first pulling-up circuit and the first pulling-down circuit according to a control signal; and a second driving unit, comprising: a second pulling-up circuit, for selectively coupling the output terminal to the high voltage according to a second input signal; a second pulling-down circuit, for selectively coupling the output terminal to the low voltage according to the second input signal; and a pair of second switches, for selectively enabling/disabling the second pulling-up circuit and the second pulling-down circuit according to the control signal, wherein in all of the interpolation cells, driving capabilities of the first pulling-up circuits and the second pulling-up circuits are not all equal, and/or driving capabilities of the first pulling-down circuits and the second pulling-down circuits are not all equal.

In another exemplary embodiment, the disclosure is directed to a driving unit for use in an interpolator, comprising: a first impedance device; a second impedance device; a first transistor, having a control terminal for receiving an input signal; a second transistor, having a control terminal for receiving the input signal; a first switch, controlled by an inverted control signal; and a second switch, controlled by a control signal, wherein the first impedance device, the first transistor, and the first switch are coupled in series between a high voltage and an output terminal of the interpolator, and the second impedance device, the second transistor, and the second switch are coupled in series between the output terminal of the interpolator and a low voltage.

In one exemplary embodiment, the disclosure is directed to a method for interpolation, comprising the steps of: providing a plurality of interpolation cells, wherein each of the interpolation cells comprises a first driving unit and a second driving unit, wherein the first driving unit comprises a first pulling-up circuit and a first pulling-down circuit, and the second driving unit comprises a second pulling-up circuit and a second pulling-down circuit; controlling the respective first pulling-up circuits to selectively couple an output terminal to a high voltage according to a first input signal; controlling the respective first pulling-down circuits to selectively couple the output terminal to a low voltage according to the first input signal; controlling the respective second pulling-up circuits to selectively couple the output terminal to the high voltage according to a second input signal, wherein the first input signal has a leading phase in comparison to the second input signal; controlling the respective second pulling-down circuits to selectively couple the output terminal to the low voltage according to the second input signal; adjusting the respective first pulling-up circuits, the respective first pulling-down circuits, the respective second pulling-up circuits, and the respective second pulling-down circuits such that driving capabilities of the first pulling-up circuits and the second pulling-up circuits are not all equal, and/or that driving capabilities of the first pulling-down circuits and the second pulling-down circuits are not all equal; and outputting an interpolation signal from the output terminal.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures thereof in the invention are shown in detail as follows.

Figure 1:
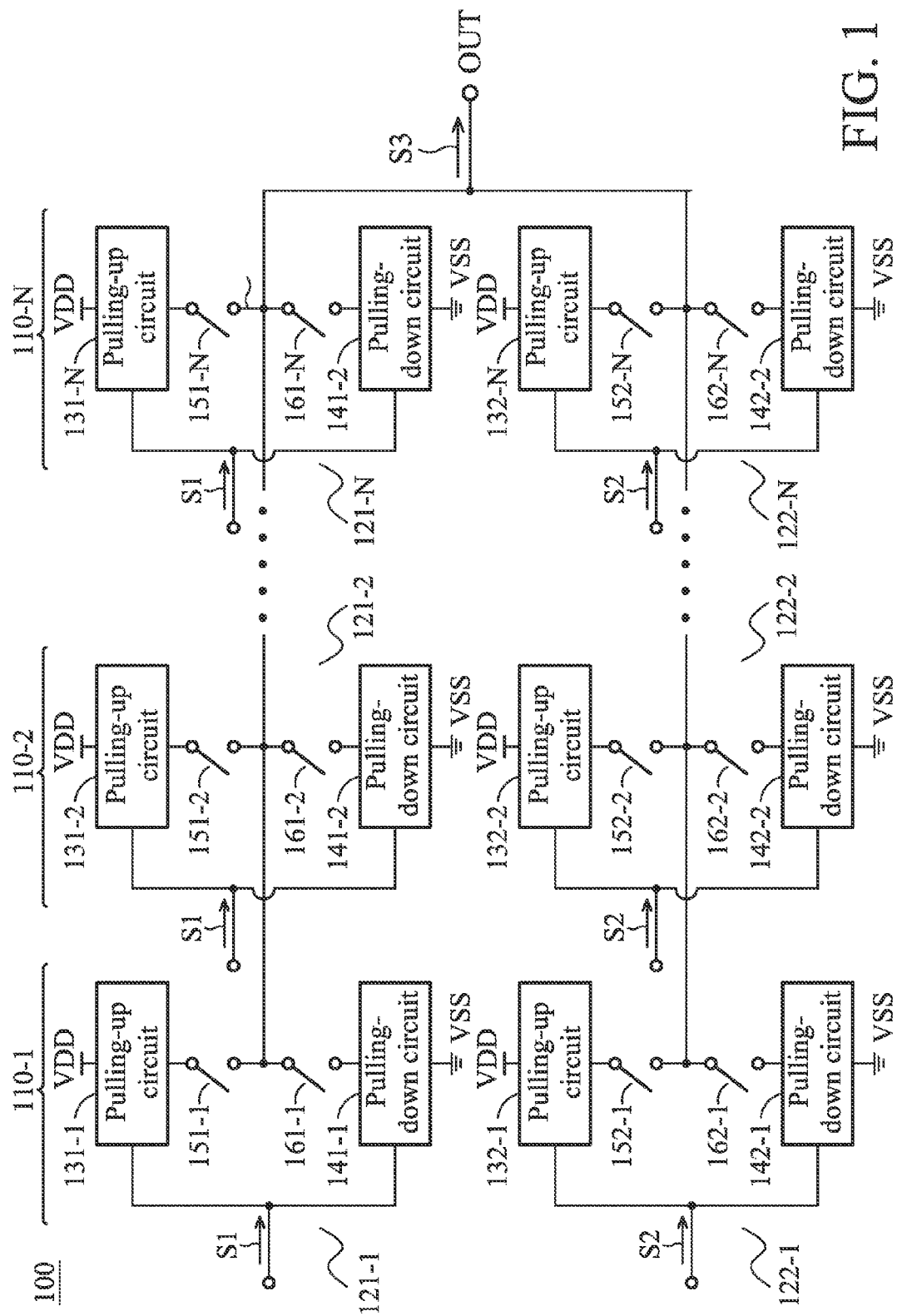
FIG. 1 is a diagram for illustrating an interpolator according to an embodiment of the invention.

FIG. 1 is a diagram for illustrating an interpolator 100 according to an embodiment of the invention. As shown in FIG. 1, the interpolator 100 comprises a plurality of interpolation cells 110-1, 110-2, . . . , and 110-N (N is a positive integer which is greater than or equal to 2). Each of the interpolation cells 110-1, 110-2, . . . , and 110-N comprises a first driving unit and a second driving unit. For example, the interpolation cell 110-1 comprises a first driving unit 121-1 and a second driving unit 122-1. More particularly, the first driving unit 121-1 comprises a first pulling-up circuit 131-1, a first pulling-down circuit 141-1, and a pair of first switches 151-1 and 161-1, and the second driving unit 122-1 comprises a second pulling-up circuit 132-1, a second pulling-down circuit 142-1, and a pair of second switches 152-1 and 162-1.

The first pulling-up circuit 131-1 is configured to selectively couple an output terminal OUT to a high voltage VDD according to a first input signal S1 (i.e. contributing a high voltage at the output terminal OUT according to the first input signal S1). The output terminal OUT is used to output an interpolation signal S3. The first pulling-down circuit 141-1 is configured to selectively couple the output terminal OUT to a low voltage VSS according to the first input signal S1 (i.e. contributing a low voltage at the output terminal OUT according to the first input signal S1). The first switches 151-1 and 161-1 are configured to selectively enable/disable the first pulling-up circuit 131-1 and the first pulling-down circuit 141-1 according to a control signal (not shown in FIG. 1). For example, by turning on (i.e. close) the first switches 151-1 and 161-1, the first pulling-up circuit 131-1 and the first pulling-down circuit 141-1 are coupled to the output terminal OUT (that is, selectively enable the first pulling-up circuit 131-1 and the first pulling-down circuit 141-1); by turning off (i.e. open) the first switches 151-1 and 161-1, the first pulling-up circuit 131-1 and the first pulling-down circuit 141-1 are decoupled from the output terminal OUT (that is, selectively disable the first pulling-up circuit 131-1 and the first pulling-down circuit 141-1). Please be noted that the switches may have other configurations to provide the "enable/disable" functionality. The positions of the first switches 151-1 and 161-1 are not restricted as shown in FIG. 1. The first switch 151-1 may be moved, for example, to be disposed between the high voltage VDD and the first pulling-up circuit 131-1, and the first switch 161-1 may be moved, for example, to be disposed between the pulling-down circuit 141-1 and the low voltage VSS. In this way, by turning on (i.e. close) the first switches 151-1 and 161-1, the first pulling-up circuit 131-1 and the first pulling-down circuit 141-1 are coupled to the power terminal VDD or VSS (that is, selectively enable the first pulling-up circuit 131-1 and the first pulling-down circuit 141-1); by turning off (i.e. open) the first switches 151-1 and 161-1, the first pulling-up circuit 131-1 and the first pulling-down circuit 141-1 are decoupled from the power terminal VDD or VSS (that is, selectively disable the first pulling-up circuit 131-1 and the first pulling-down circuit 141-1). The modifications achieving similar functionalities shall all fall within the scope of the present invention. In some embodiments, the first switches 151-1 and 161-1 are either both closed or both opened such that the whole first driving unit 121-1 is either enabled or disabled. The second pulling-up circuit 132-1 is configured to selectively couple the output terminal OUT to the high voltage VDD according to a second input signal S2 (i.e. contributing a high voltage at the output terminal OUT according to the second input signal S2). In some embodiments, the first input signal S1 has a leading phase in comparison to the second input signal S2, and the interpolator 100 generates more phases out of the phases of the first input signal S1 and the second input signal S2. The second pulling-down circuit 142-1 is configured to selectively couple the output terminal OUT to the low voltage VSS according to the second input signal S2 (i.e. contributing a low voltage at the output terminal OUT according to the second input signal S2). The second switches 152-1 and 162-1 are configured to selectively enable/disable the second pulling-up circuit 132-1 and the second pulling-down circuit 142-1 according to the control signal. The positions of the second switches 152-1 and 162-1 are not restricted to those shown in FIG. 1. The second switch 152-1 may be moved, for example, to be disposed between the high voltage VDD and the second pulling-up circuit 132-1, and the second switch 162-1 may be moved, for example, to be disposed between the second pulling-down circuit 142-1 and the low voltage VSS. The operations of the second switches 152-1 and 162-1 are similar to those of the first switches 151-1 and 161-1, and therefore detailed description is omitted here for brevity. In some embodiments, the second switches 152-1 and 162-1 are either both closed or both opened such that the whole second driving unit 122-1 is either enabled or disabled. Note that for simplicity, in this embodiment, when one of the first driving unit 121-1 and the second driving unit 122-1 is enabled, another of the first driving unit 121-1 and the second driving unit 122-1 is disabled. However, this is not meant to be a limitation for the present invention.

The other interpolation cells 110-2, . . . , and 110-N work in a similar way to the interpolation cell 110-1. However, for all of the interpolation cells 110-1, 110-2, . . . , and 110-N, driving capabilities are not all equal in order to enhance the linearity of the phase interpolator 100. More specifically, driving capabilities of the first pulling-up circuits 131-1, 131-2, . . . , and 131-N and the second pulling-up circuits 132-1, 132-2, . . . , and 132-N are not all equal, and/or driving capabilities of the first pulling-down circuits 141-1, 141-2, . . . , and 141-N and the second pulling-down circuits 142-1, 142-2, . . . , and 142-N are not all equal. The non-uniform driving capabilities may result from non-uniform transistor sizes or non-uniform impedance values thereof. A more detailed description will be presented in the following paragraph. A processor (not shown) can generate the control signal to selectively enable/disable some or all of the first driving units 121-1, 121-2, . . . , and 121-N and to selectively enable/disable some or all of the second driving unit 122-1, 122-2, . . . , and 122-N such that the phase of the interpolation signal S3 is controlled. For example, if it is assumed that N is equal to 10, the processor, for example, may enable ten of the first driving units (e.g. 121-1, 121-2, . . . , 121-10) to generate the interpolation signal S3 having a leading phase, enable five of the first driving units (e.g. 121-6, 121-7, . . . , 121-10) and five of the second driving units (e.g. 122-1, 122-2, . . . , 122-5) to generate the interpolation signal S3 having a middle phase, or enable ten of the second driving units (e.g. 122-1, 122-2, . . . , 122-10) to generate the interpolation signal S3 having a lagging phase.

Figure 2:
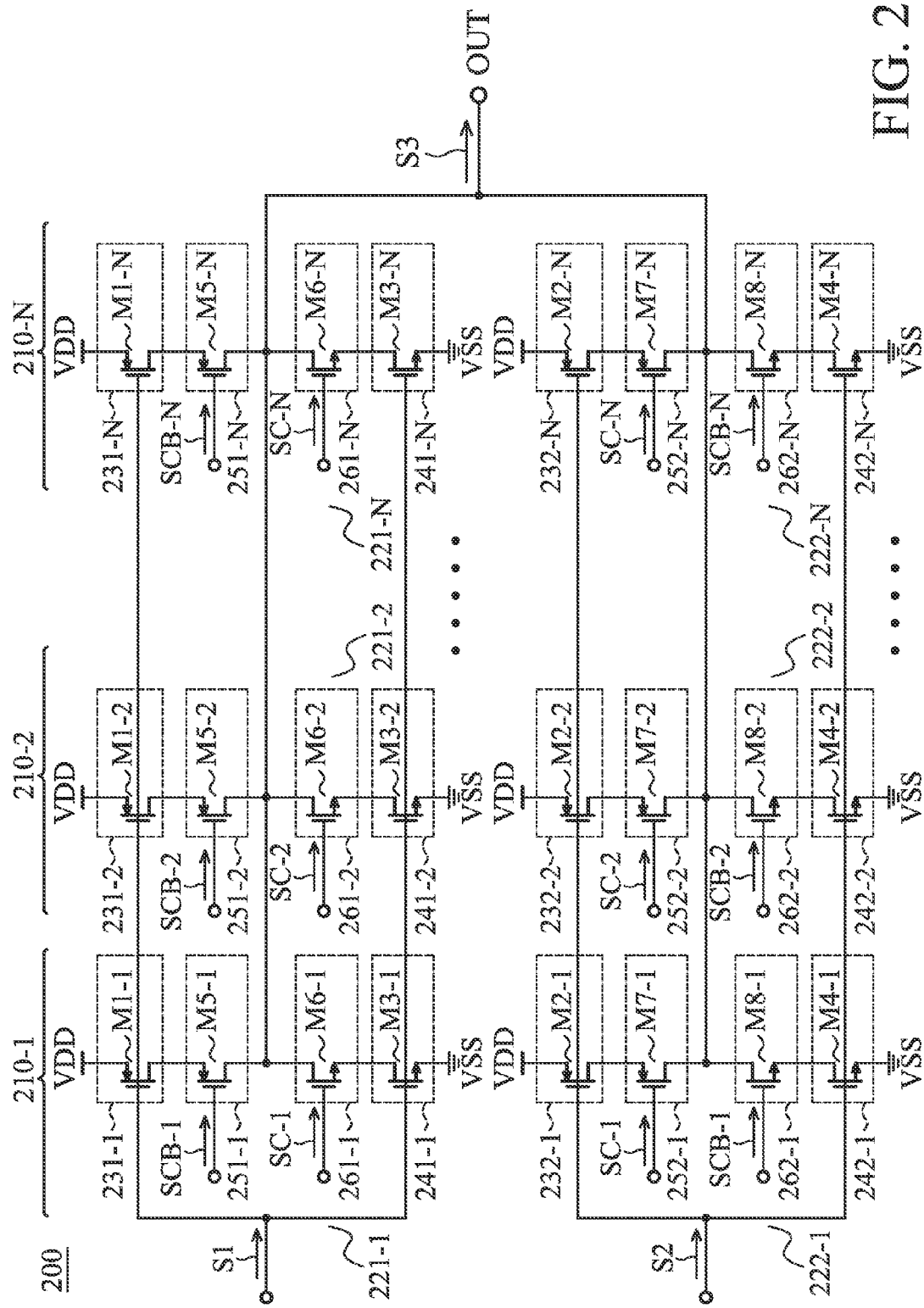
FIG. 2 is a diagram for illustrating an interpolator according to another embodiment of the invention.

FIG. 2 is a diagram for illustrating an interpolator 200 according to another embodiment of the invention. In the embodiment, each pulling-up/pulling-down circuit comprises a transistor. For example, in an interpolation cell 210-1, a first pulling-up circuit 231-1 comprises a transistor M1-1 having a control terminal for receiving the first input signal S1, a first terminal coupled to the high voltage VDD, and a second terminal coupled to the output terminal OUT (possibly through a first switch 251-1), and a second pulling-up circuit 232-1 comprises a transistor M2-1 having a control terminal for receiving the second input signal S2, a first terminal coupled to the high voltage VDD, and a second terminal coupled to the output terminal OUT (possibly through a second switch 252-1). The first pulling-down circuit 241-1 comprises a transistor M3-1 having a control terminal for receiving the first input signal S1, a first terminal coupled to the low voltage VSS, and a second terminal coupled to the output terminal OUT (possibly through another first switch 261-1), and the second pulling-down circuit 242-1 comprises a transistor M4-1 having a control terminal for receiving the second input signal S2, a first terminal coupled to the low voltage VSS, and a second terminal coupled to the output terminal OUT (possibly through another second switch 262-1). In the embodiment, each switch also comprises a transistor. For example, in the interpolation cell 210-1, the first switch 251-1 comprises a transistor M5-1 having a control terminal for receiving an inverted control signal SCB-1 and is configured to selectively enable/disable the first pulling-up circuit 231-1 (e.g., to selectively couple/de-couple the transistor M1-1 to/from the output terminal OUT). The first switch 261-1 comprises a transistor M6-1 having a control terminal for receiving a control signal SC-1 and is configured to selectively enable/disable the first pulling-down circuit 241-1 (e.g., to selectively couple/de-couple the transistor M3-1 to/from the output terminal OUT). The second switch 252-1 comprises a transistor M7-1 having a control terminal for receiving the control signal SC-1 and is configured to selectively enable/disable the second pulling-up circuit 232-1 (e.g., to selectively couple/de-couple the transistor M2-1 to/from the output terminal OUT). The second switch 262-1 comprises a transistor M8-1 having a control terminal for receiving the inverted control signal SCB-1 and is configured to selectively enable/disable the second pulling-down circuit 242-1 (e.g., to selectively couple/de-couple the transistor M4-1 to/from the output terminal OUT). The control signal SC-1 and the inverted control signal SCB-1 are complementary, and are included in the control signal mentioned previously in the embodiment of FIG. 1. Accordingly, when one of a first driving unit 221-1 and a second driving unit 222-1 is enabled, another of the first driving unit 221-1 and the second driving unit 222-1 is disabled. In some embodiments, the transistors M1-1, M2-1, M5-1, and M7-1 are PMOS transistors (P-channel Metal-Oxide Field-Effect Transistor), and the transistors M3-1, M4-1, M6-1, and M8-1 are NMOS transistors (N-channel Metal-Oxide Field-Effect Transistor). In some embodiments, the transistors M1-1, M2-1, M5-1, and M7-1 are PNP-type bipolar junction transistors, and the transistors M3-1, M4-1, M6-1, and M8-1 are NPN-type bipolar junction transistors. Note that the invention is not limited to the above. The first switches 251-1 and 261-1 and the second switches 252-1 and 262-1 may be implemented with other types of electronic components, and the positions thereof may be changed as mentioned previously in the embodiment of FIG. 1.

The other interpolation cells 210-2, ..., and 210-N work in a similar way to the interpolation cell 210-1. However, for all of the interpolation cells 210-1, 210-2, ..., and 210-N, transistor sizes of the transistors M1-1, M1-2, ..., and M1-N are not all equal, transistor sizes of the transistors M2-1, M2-2, ..., and M2-N are not all equal, transistor sizes of the transistors M3-1, M3-2, ..., and M3-N are not all equal, and/or transistor sizes of the transistors M4-1, M4-2, ..., and M4-N are not all equal. Accordingly, driving capabilities of the first pulling-up circuits 231-1, 231-2, ..., and 231-N and the second pulling-up circuits 232-1, 232-2, ..., and 232-N are not all equal, and/or driving capabilities of the first pulling-down circuits 241-1, 241-2, ..., and 241-N and the second pulling-down circuits 242-1, 242-2, ..., and 242-N are not all equal. When the interpolation signal S3 with a relatively leading phase is desired, the control signal (hereinafter, the term "control signal" may include the control signal SC-1, SC-2, ..., and SC-N and the inverted control signal SCB-1, SCB-2, ..., and SCB-N) controls the first switches 251-1, 251-2, ..., and 251-N and 261-1, 261-2, ..., and 261-N to disable one or more of the first driving units 221-1, 221-2, ..., and 221-N having a relatively smaller transistor size (which leads to poorer driving capability) and enable one or more of the first driving units 221-1, 221-2, ..., and 221-N having a relatively larger transistor size (which leads to better driving capability), and controls the second switches 252-1, 252-2, ..., and 252-N and 262-1, 262-2, ..., and 262-N to enable one or more of the second driving units 222-1, 222-2, ..., and 222-N having a relatively smaller transistor size (which leads to poorer driving capability) and disable one or more of the second driving units 222-1, 222-2, ..., and 222-N having a relatively larger transistor size (which leads to better driving capability). On the contrary, when the interpolation signal S3 with a relatively lagging phase is desired, the control signal controls the first switches 251-1, 251-2, ..., and 251-N and 261-1, 261-2, ..., and 261-N to disable one or more of the first driving units 221-1, 221-2, ..., and 221-N having a relatively larger transistor size (which leads to better driving capability) and enable one or more of the first driving units 221-1, 221-2, ..., and 221-N having a relatively smaller transistor size (which leads to poorer driving capability), and controls the second switches 252-1, 252-2, ..., and 252-N and 262-1, 262-2, ..., and 262-N to enable one or more of the second driving units 222-1, 222-2, ..., and 222-N having a relatively larger transistor size (which leads to better driving capability) and disable one or more of the second driving units 222-1, 222-2, ..., and 222-N having a relatively smaller transistor size (which leads to poorer driving capability). By doing this, the linearity of the interpolator 200 can be improved as compared with the conventional interpolators.

Figure 3A:
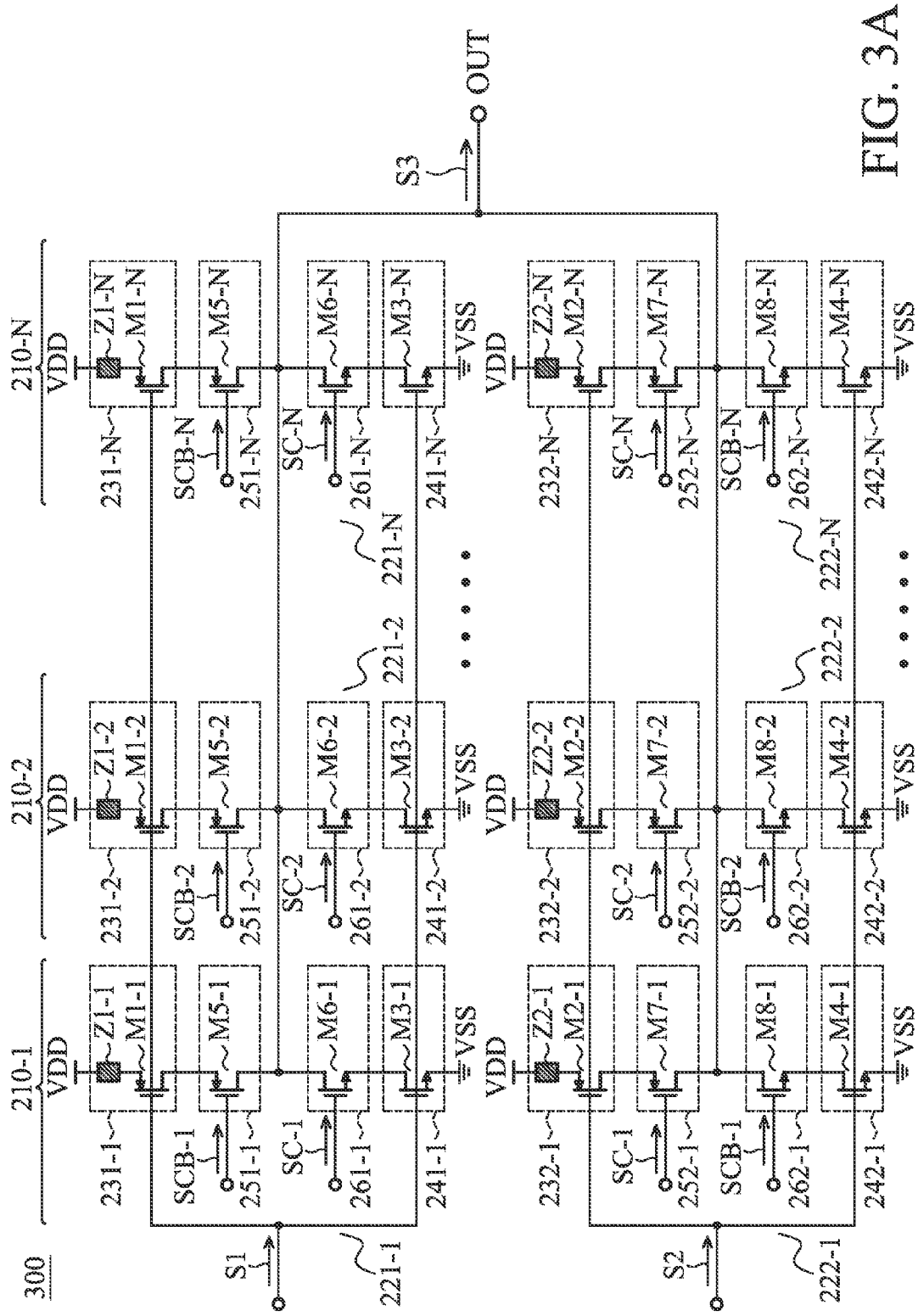
FIG. 3A is a diagram for illustrating an interpolator according to an embodiment of the invention.

FIG. 3A is a diagram for illustrating an interpolator 300 according to an embodiment of the invention. FIG. 3A is similar to FIG. 2. In the embodiment, each pulling-up circuit may further comprise an impedance device. For example, in the interpolation cell 210-1, the first pulling-up circuit 231-1 further comprises an impedance device Z1-1, and the second pulling-up circuit 232-1 further comprises an impedance device Z2-1. The positions of the impedance devices Z1-1 and Z2-1 are not restricted to those shown in FIG. 3A. The impedance device Z1-1 may be moved, for example, to be disposed between the first switch 251-1 and the output terminal OUT, and the impedance device Z2-1 may be moved, for example, to be disposed the second switch 252-1 and the output terminal OUT. As long as the impedance device Z1-1, the transistor M1-1 and the switch M5-1 are coupled in series (not restricted in any particular order) between the high voltage VDD and the output terminal OUT, a similar result can be achieved. The other interpolation cells 210-2, ..., and 210-N are arranged in a similar way to the interpolation cell 210-1. However, for all of the interpolation cells 210-1, 210-2, ..., and 210-N, impedance values of the impedance devices Z1-1, Z1-2, ..., and Z1-N are not all equal, and/or impedance values of the impedance devices Z21, Z2-2, ..., and Z2-N are not all equal. In some embodiments, the impedance devices Z1-1, Z1-2, ..., and Z1-N may be a plurality of resistors having non-uniform resistances, and the impedance devices Z2-1, Z2-2, ..., and Z2-N may be other plurality of resistors having non-uniform resistances. Accordingly, driving capabilities of the first pulling-up circuits 231-1, 231-2, ..., and 231-N and the second pulling-up circuits 232-1, 232-2, ..., and 232-N are not all equal. When the interpolation signal S3 with a relatively leading phase is desired, the control signal controls the first switches 251-1, 251-2, ..., and 251-N and 261-1, 261-2, ..., and 261-N to disable one or more of the first driving units 221-1, 221-2, ..., and 221-N having a relatively larger impedance value (which leads to poorer driving capability) and enable one or more of the first driving units 221-1, 221-2, ..., and 221-N having a relatively smaller impedance value (which leads to stronger driving capability), and controls the second switches 252-1, 252-2, ..., and 252-N and 262-1, 262-2, ..., and 262-N to enable one or more of the second driving units 222-1, 222-2, ..., and 222-N having a relatively larger impedance value (which leads to poorer driving capability) and disable one or more of the second driving units 222-1, 222-2, ..., and 222-N having a relatively smaller impedance value (which leads to stronger driving capability). On the contrary, when the interpolation signal S3 with a relatively lagging phase is desired, the control signal controls the first switches 251-1, 251-2, ..., and 251-N and 261-1, 261-2, ..., and 261-N to disable one or more of the first driving units 221-1, 221-2, ..., and 221-N having relatively smaller impedance values (which leads to stronger driving capability) and enable one or more of the first driving units 221-1, 221-2, ..., and 221-N having relatively larger impedance values (which leads to poorer driving capability), and controls the second switches 252-1, 252-2, ..., and 252-N and 262-1, 262-2, ..., and 262-N to enable one or more of the second driving units 222-1, 222-2, ..., and 222-N having relatively smaller impedance values (which leads to stronger driving capability) and disable one or more of the second driving units 222-1, 222-2, ..., and 222-N having relatively larger impedance values (which leads to poorer driving capability). In other embodiments, the impedance devices Z1-1, ..., Z1-N and Z2-1, ..., Z2-N may be implemented by transistors. As a skilled person can appreciate after reading above disclosure, detailed description is omitted for brevity.

Figure 3B:
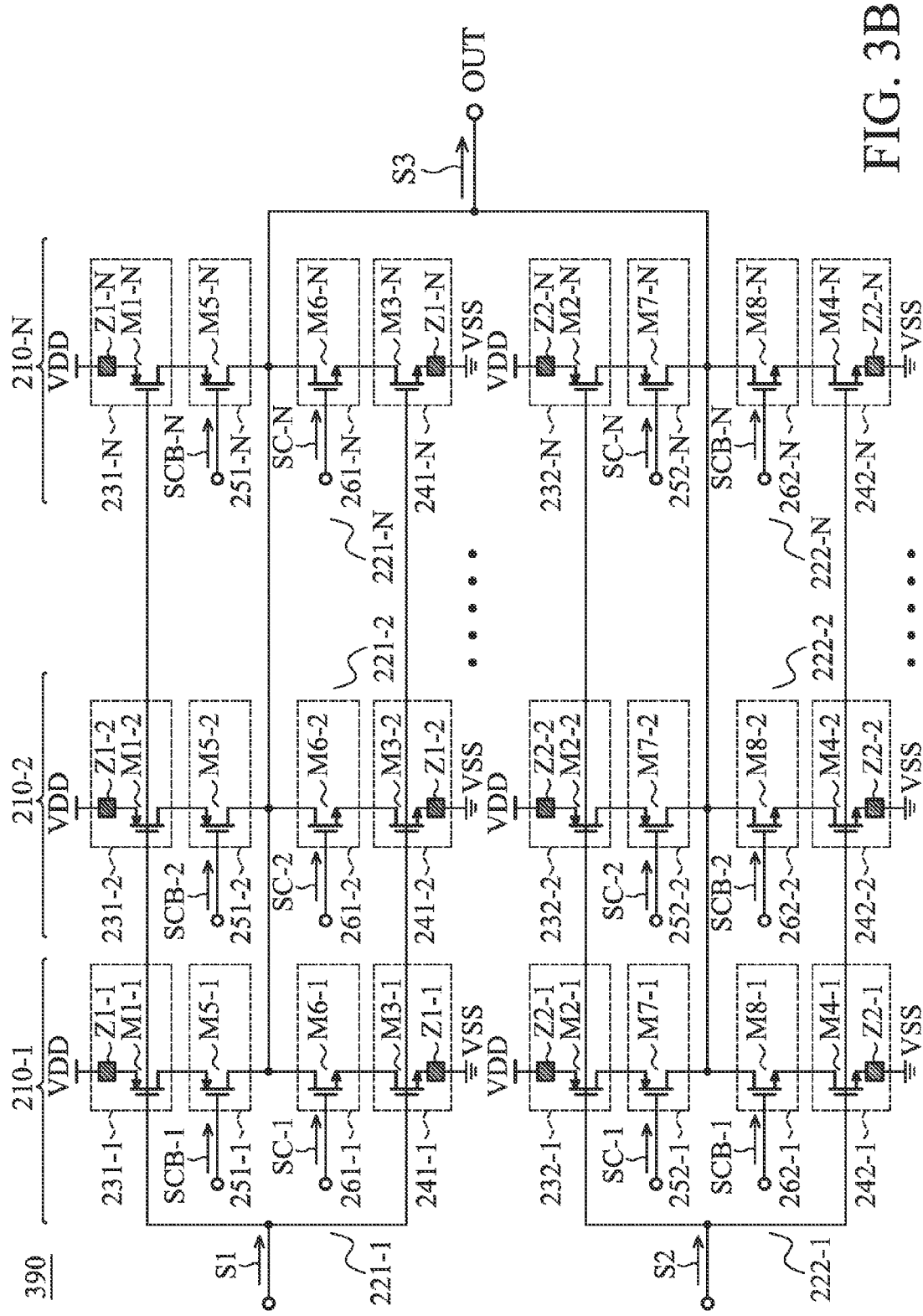
FIG. 3B is a diagram for illustrating an interpolator according to another embodiment of the invention.

Some adjustments may be made in the embodiment of FIG. 3A as follows. FIG. 3B is a diagram for illustrating an interpolator 390 according to another embodiment of the invention. Each pulling-down circuit may further comprise an impedance device. For example, in the interpolation cell 210-1, the first pulling-down circuit 241-1 further comprises an impedance device Z1-1, and the second pulling-down circuit 242-1 further comprises an impedance device Z2-1. The positions of the impedance devices Z1-1 and Z2-1 are not restricted. The impedance device Z1-1 may be disposed, for example, between the transistor M3-1 and the low voltage VSS, and the impedance device Z2-1 may be disposed, for example, between the transistor M4-1 and the low voltage VSS. As long as the impedance device Z1-1, the transistor M3-1 and the switch M6-1 are coupled in series (not restricted in any particular order) between the low voltage VSS and the output terminal OUT, a similar result can be achieved. The other interpolation cells 210-2, ..., and 210-N are arranged in a similar way to the interpolation cell 210-1. As mentioned previously, for all of the interpolation cells 210-1, 210-2, ..., and 210-N, impedance values of the impedance devices Z1-1, Z1-2, ..., and Z1-N are not all equal, and/or impedance values of the impedance devices Z2-1, Z2-2, ..., and Z2-N are not all equal. Similarly, when the interpolation signal S3 with a relatively leading phase is desired, the control signal controls the first switches 251-1, 251-2, ..., and 251-N and 261-1, 261-2, ..., and 261-N to disable one or more of the first driving units 221-1, 221-2, ..., and 221-N having a relatively larger impedance value and enable one or more of the first driving units 221-1, 221-2, ..., and 221-N having a relatively smaller impedance value, and controls the second switches 252-1, 252-2, ..., and 252-N and 262-1, 262-2, ..., and 262-N to enable one or more of the second driving units 222-1, 222-2, ..., and 222-N having a relatively larger impedance value and disable one or more of the second driving units 222-1, 222-2, ..., and 222-N having a relatively smaller impedance value. When the interpolation signal S3 with a relatively lagging phase is desired, the control signal controls the first switches 251-1, 251-2, ..., and 251-N and 261-1, 261-2, ..., and 261-N to disable one or more of the first driving units 221-1, 221-2, ..., and 221-N having a relatively smaller impedance value and enable one or more of the first driving units 221-1, 221-2, ..., and 221-N having a relatively larger impedance value, and controls the second switches 252-1, 252-2, ..., and 252-N and 262-1, 262-2, ..., and 262-N to enable one or more of the second driving units 222-1, 222-2, ..., and 222-N having a relatively smaller impedance value and disable one or more of the second driving units 222-1, 222-2, ..., and 222-N having a relatively larger impedance value. Note that one or each of the first pulling-up circuit and the first pulling-down circuit may comprise an impedance device, and one or each of the second pulling-up circuit and the second pulling-down circuit may comprise an impedance device. The impedance devices comprised in the pulling-up circuits are helpful to the linearity of the rising edges of the interpolation signal S3, while the impedance devices comprised in the pulling-down circuits are helpful to the linearity of the falling edges. These impedance devices may have non-uniform impedance values. Furthermore, although the impedance devices comprised in the pulling-up circuit and the respective pulling-down circuit are labeled by the same numeral in FIG. 3B, it does not mean that the impedance values must be exactly the same. The impedance values could be subjected to circuit design choices.

In summary, referring back to FIG. 1, the invention can operate as follows. Based on the driving capabilities of the first pulling-up circuits 131-1, 131-2, ..., and 131-N, the second pulling-up circuits 132-1, 132-2, ..., and 132-N, the first pulling-down circuits 141-1, 141-2, ..., and 141-N, and the second pulling-down circuits 142-1, 142-2, ..., and 142-N, the control signal controls the respective pairs of first switches 151-1, 151-2, ..., and 151-N and 161-1, 161-2, ..., and 161-N and the respective pairs of second switches 152-1, 152-2, ..., and 152-N and 162-1, 162-2, ..., and 162-N to selectively enable/disable the respective first pulling-up circuits 131-1, 131-2, ..., and 131-N, the respective first pulling-down circuits 141-1, 141-2, ..., and 141-N, the respective second pulling-up circuits 132-1, 132-2, ..., and 132-N, and the respective second pulling-down circuits 142-1, 142-2, ..., and 142-N. When the interpolation signal S3 with a relatively leading phase is desired, the control signal controls the pairs of first switches 151-1, 151-2, ..., and 151-N and 161-1, 161-2, ..., and 161-N to disable one or more the first driving units 121-1, 121-2, ..., and 121-N having a relatively poorer driving capability and enable one or more of the first driving units 121-1, 121-2, ..., and 121-N having a relatively stronger driving capability, and controls the pairs of second switches 152-1, 152-2, ..., and 152-N and 162-1, 162-2, ..., and 162-N to enable one or more of the second driving units 122-1, 122-2, ..., and 122-N having a relatively poorer driving capability and disable one or more of the second driving units 122-1, 122-2, ..., and 122-N having a relatively stronger driving capability. On the contrary, when the interpolation signal S3 with a relatively lagging phase is desired, the control signal controls the pairs of first switches 151-1, 151-2, ..., and 151-N and 161-1, 161-2, ..., and 161-N to disable one or more the first driving units 121-1, 121-2, ..., and 121-N having a relatively stronger driving capability and enable one or more of the first driving units 121-1, 121-2, ..., and 121-N having a relatively poorer driving capability, and controls the pairs of second switches 152-1, 152-2, ..., and 152-N and 162-1, 162-2, ..., and 162-N to enable one or more of the second driving units 122-1, 122-2, ..., and 122-N having a relatively stronger driving capability and disable one or more of the second driving units 122-1, 122-2, ..., and 122-N having a relatively poorer driving capability. The non-uniform driving capabilities of the interpolation units 110-1, 110-2, ..., and 110-N can help reduce signal nonlinearity of the output interpolation signal S3. Refer to the embodiments of FIGS. 4-7 in the following paragraph for clearer understanding.

Figure 4:
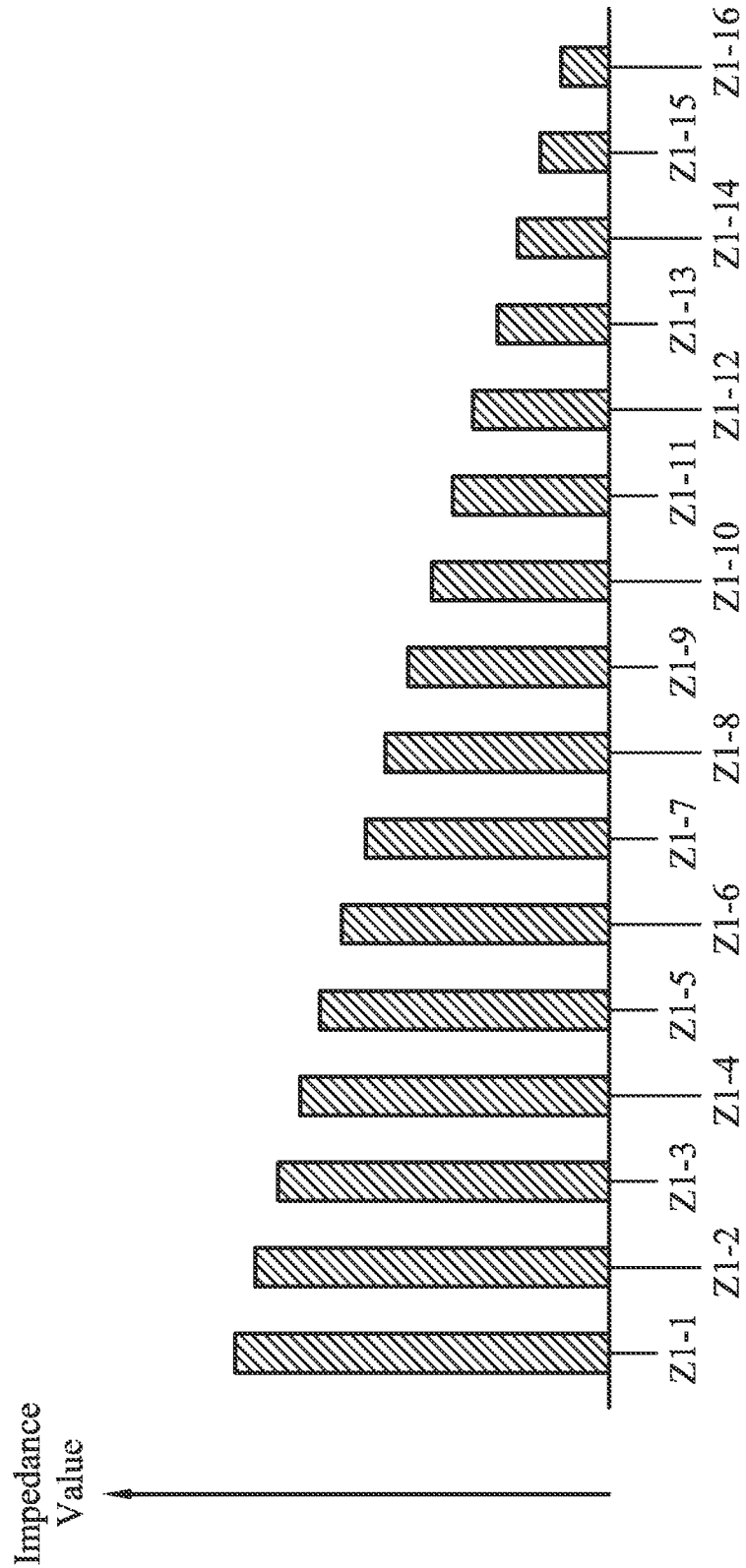
FIG. 4 is a diagram for illustrating non-uniform driving capabilities of interpolation cells of an interpolator according to an embodiment of the invention.

FIG. 4 is a diagram for illustrating non-uniform driving capabilities of the interpolation cells 210-1, 210-2, ..., and 210-N of the interpolator 300 according to an embodiment of the invention. Refer to FIGS. 3A, 3B, and 4 together. The impedance devices Z1-1, Z1-2, ..., Z1-N and Z2-1, Z2-2, ..., and Z2-N of FIGS. 3A and 3B have non-uniform impedance values. In the embodiment, it is assumed that N is equal to 16, but is not limited thereto. As shown in FIG. 4, lengths of a plurality of bars represent impedance values of the impedance devices Z1-1, Z1-2, ..., and Z1-16, respectively. In other words, the impedance values are arranged to gradually decrease from the impedance device Z1-1 to the impedance device Z1-16. The impedance values of the impedance devices Z2-1, Z2-2, ..., and Z2-16 may be substantially equal to those of the impedance devices Z1-1, Z1-2, ..., and Z1-16, respectively. Interpolator cell with largest impedance value (e.g. interpolator cell 210-1) is considered to be equipped with poorest driving capability, while interpolator cell with smallest impedance value (e.g. interpolator cell 210-16) is considered to be equipped with strongest driving capability. When the interpolation signal S3 with a relatively leading phase is desired, a first procedure is performed to select some or all of the interpolation cells 210-1, 210-2, ..., and 210-N one after another such that the first driving unit of the selected interpolation cell is enabled and the second driving unit of the selected interpolation cell is disabled. The selection is from the interpolation cell having a relatively smaller impedance value to the interpolation cell having a relatively larger impedance value. For example, the selection of the first procedure is from the interpolation cell 210-16 comprising the impedance devices Z1-16 and Z2-16 to the interpolation cell 210-1 comprising the impedance devices Z1-1 and Z2-1. In this case, the first driving units 221-16 to 221-1 are enabled in order one after another, and the second driving unit 222-16 to 222-1 are disabled in order one after another. In other words, when the interpolation signal S3 with a relatively lagging phase is desired, the interpolation cell having a relatively larger impedance value is first selected rather than the interpolation cell having a relatively smaller impedance value, where the first driving unit of the selected interpolation cell is disabled and the second driving unit of the selected interpolation cell is enabled. For example, the selection is from the interpolation cell 210-1 comprising the impedance devices Z1-1 and Z2-1 to the interpolation cell 210-16 comprising the impedance devices Z1-16 and Z2-16. In this case, the first driving units 221-1 to 221-16 are disabled in order one after another, and the second driving unit 222-1 to 222-16 are enabled in order one after another. In this embodiment, the resolution A of the interpolation phase of the interpolation signal S3 is (P2−P1)/16, where P2 represents the phase of the second input signal S2, and P1 represents the phase of the first input signal S1. Taking the interpolation signal S3 with the phase equal to (P1'+2Δ) as an example (where P r represents the most leading phase generated by the interpolator enabling all of the first driving units and disabling all of the second driving units), the interpolation cell 210-16 comprising the impedance devices Z1-16 and Z2-16, the interpolation cell 210-15 comprising the impedance devices Z1-15 and Z2-15, ..., and the interpolation cell 210-3 comprising the impedance devices Z1-3 and Z2-3 are selected, that is, the first driving units 221-16, 221-15, ..., and 221-3 are enabled, the first driving units 221-2 and 221-1 are disabled, the second driving units 222-16, 222-15, ..., and 222-3 are disabled, and the second driving units 222-2 and 222-1 are enabled. Taking the interpolation signal S3 with the phase equal to (P1'+3Δ) as another example, the interpolation cell 210-16 comprising the impedance devices Z1-16 and Z2-16, the interpolation cell 210-15 comprising the impedance devices Z1-15 and Z2-15, ..., and the interpolation cell 210-4 comprising the imped- ance devices Z1-4 and Z2-4 are selected, that is, the first driving units 221-16, 221-15, ..., and 221-4 are enabled, the first driving units 221-3, 221-2 and 221-1 are disabled, the second driving units 222-16, 222-15, ..., and 222-4 are disabled, and the second driving units 222-3, 222-2 and 222-1 are enabled.

Figure 5:
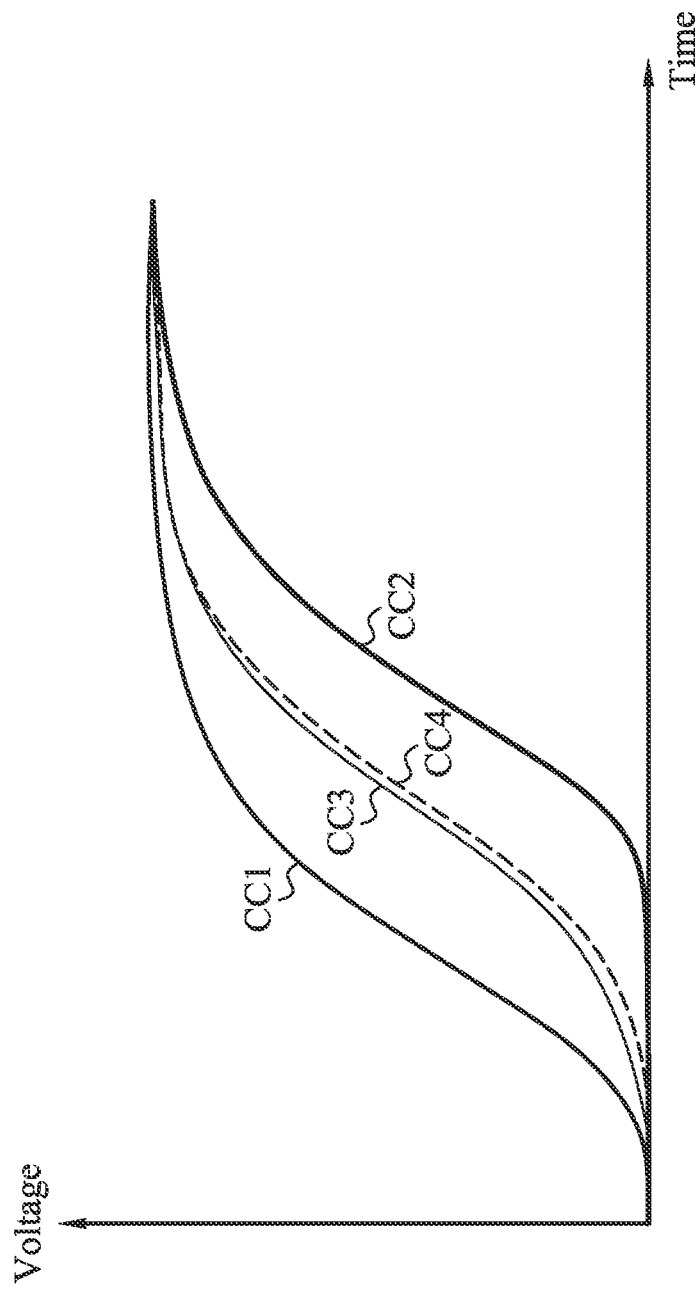
FIG. 5 is a diagram for illustrating the effectiveness of the arrangement of FIG. 4 according to an embodiment of the invention.

FIG. 5 is a diagram for illustrating the effectiveness of the arrangement of FIG. 4 according to an embodiment of the invention. The curve CC1 represents the waveform of the first input signal S1 input to the interpolator 300. The curve CC2 represents the waveform of the second input signal S2 input to the interpolator 300. The first input signal S1 has a leading phase in comparison to the second input signal S2. If the impedance values of the impedance devices Z1-1, Z1-2, ..., and Z1-16 and Z2-1, Z2-2, ..., and Z2-16 are uniform, the phase characteristic of the output interpolation signal S3 will be the curve CC4, which tends to approach the second input signal S2 too much because of unbalanced input signal slopes. If the impedance values of the impedance devices Z1-1, Z1-2, ..., and Z1-16 and Z2-1, Z2-2, ..., and Z2-16 are non-uniform and arranged for example as shown in FIG. 4, the phase characteristic of the output interpolation signal S3 will be the curve CC3. In comparison, the arrangement of FIG. 4 effectively improves the signal linearity of the output interpolation signal S3.

Figure 6:
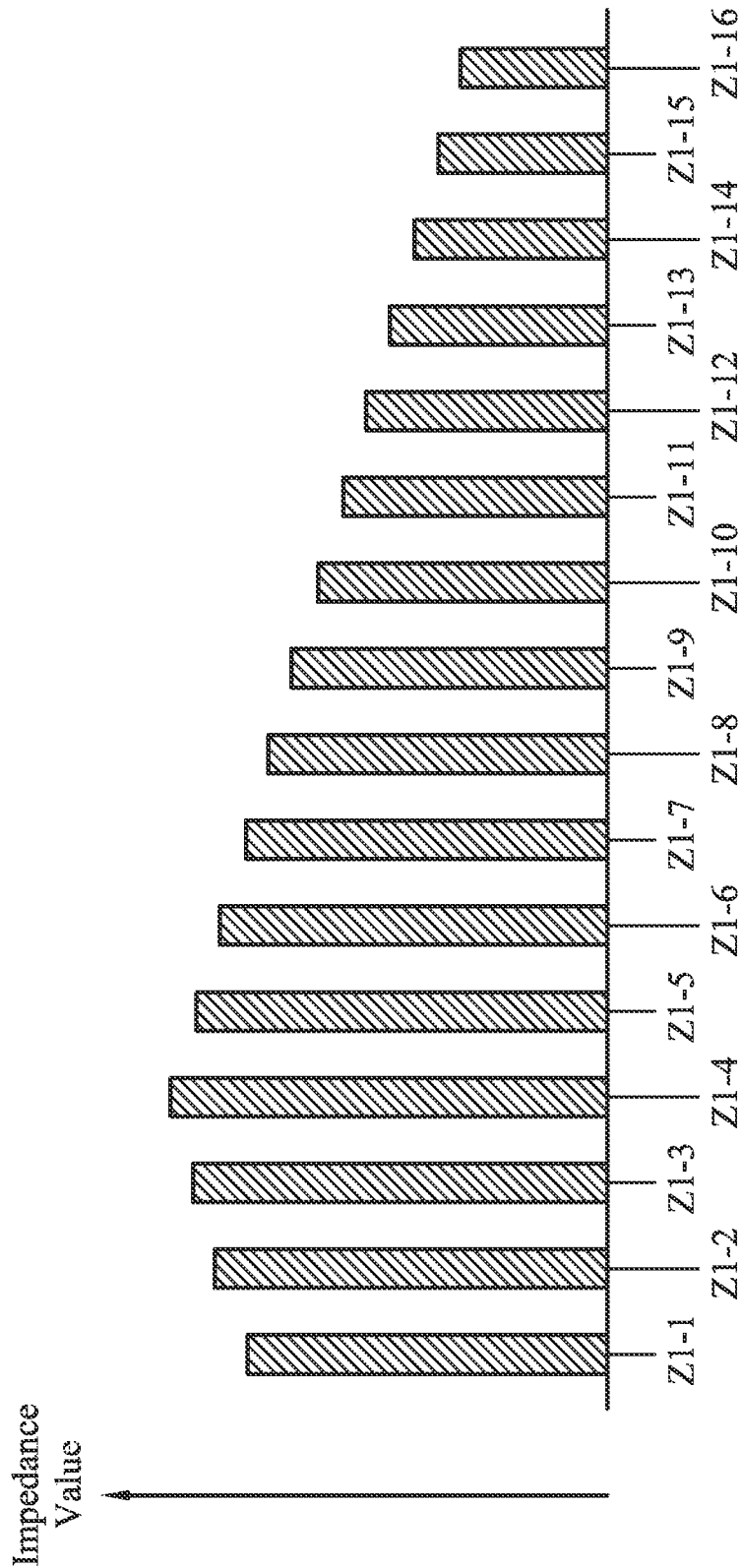
FIG. 6 is a diagram for illustrating non-uniform driving capabilities of interpolation cells of an interpolator according to an embodiment of the invention.

FIG. 6 is a diagram for illustrating non-uniform driving capabilities of the interpolation cells 210-1, 210-2, ..., and 210-N of the interpolator 300 according to an embodiment of the invention. Refer to FIGS. 3A, 3B and 6 together. The impedance devices Z1-1, Z1-2, ..., Z1-N and Z2-1, Z2-2, ..., and Z2-N of FIGS. 3A and 3B have non-uniform impedance values. In the embodiment, it is assumed that N is equal to 16, but is not limited thereto. As shown in FIG. 6, lengths of a plurality of bars represent impedance values of the impedance devices Z1-1, Z1-2, ..., and Z1-16, respectively. In other words, the impedance values are arranged to gradually increase from the impedance device Z1-1 to the impedance device Z1-4 and gradually decrease from the impedance device Z1-5 to the impedance device Z1-16. The impedance values of the impedance devices Z2-1, Z2-2, ..., and Z2-16 may be substantially equal to those of the impedance devices Z1-1, Z1-2, ..., and Z1-16, respectively. When the interpolation signal S3 with a relatively leading phase is desired, a second procedure is performed to select some or all of the interpolation cells 210-1, 210-2, ..., and 210-N one after another such that the first driving unit of the selected interpolation cell is enabled and the second driving unit of the selected interpolation cell is disabled. The selection of the second procedure is from the interpolation cell having a relatively smaller impedance value to the interpolation cell having a relatively larger impedance value to the interpolation cell having a relatively middle impedance value. For example, the selection of the second procedure is from the interpolation cell 210-16 comprising the smallest impedance devices Z1-16 and Z2-16 to the interpolation cell 210-4 comprising the largest impedance devices Z1-4 and Z2-4 to the interpolation cell 210-1 comprising the middle impedance devices Z1-1 and Z2-1. In this case, the first driving units 221-16 to 221-4 to 221-1 are enabled in order one after another, and the second driving unit 222-16 to 222-4 to 222-1 are disabled in order one after another. In other words, when the interpolation signal S3 with a relatively lagging phase is desired, the interpolation cell having a relatively middle impedance value is first selected rather than the interpolation cell having a relatively larger impedance value and rather than the interpolation cell having a relatively smaller impedance value, where the first driving unit of the selected interpolation cell is disabled and the second driving unit of the selected interpolation cell is enabled. For example, the selection is from the interpolation cell 210-1 comprising the middle impedance devices Z1-1 and Z2-1 to the interpolation cell 210-4 comprising the largest impedance devices Z1-4 and Z2-4 to the interpolation cell 210-16 comprising the smallest impedance devices Z1-16 and Z2-16. In this case, the first driving units 221-1 to 221-4 to 221-16 are disabled in order one after another, and the second driving unit 222-1 to 222-4 to 222-16 are enabled in order one after another.

Figure 7:
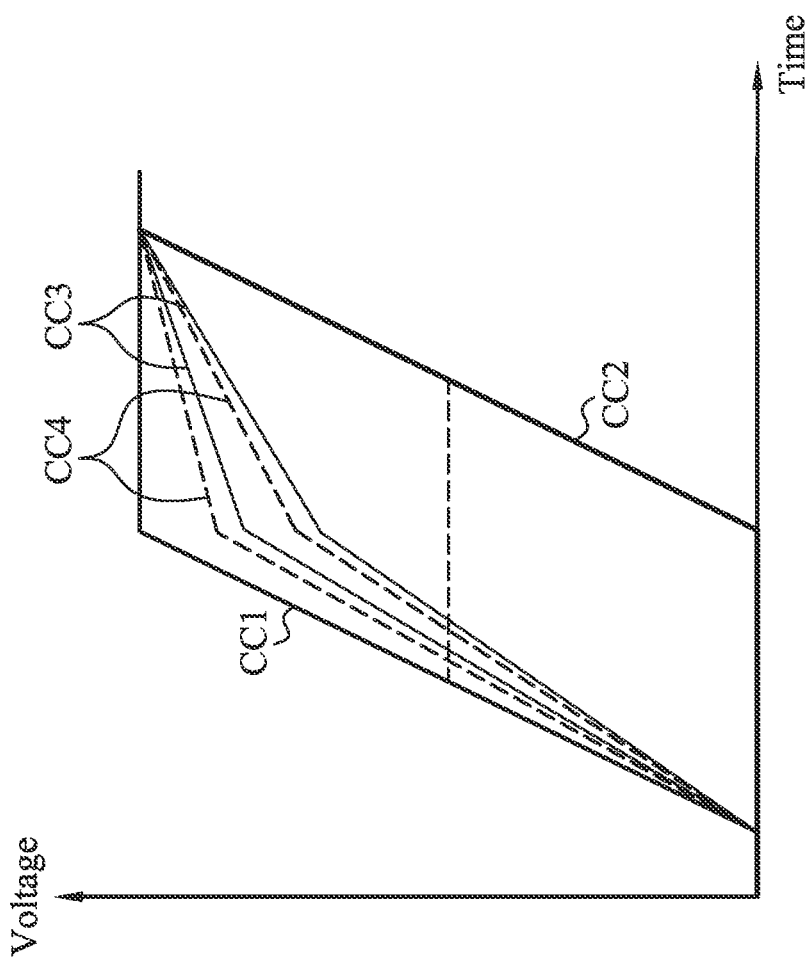
FIG. 7 is a diagram for illustrating the effectiveness of the arrangement of FIG. 6 according to an embodiment of the invention.

FIG. 7 is a diagram for illustrating the effectiveness of the arrangement of FIG. 6 according to an embodiment of the invention. The curve CC1 represents the waveform of the first input signal S1 input to the interpolator 300. The curve CC2 represents the waveform of the second input signal S2 input to the interpolator 300. The first input signal S1 has a leading phase in comparison to the second input signal S2. If the impedance values of the impedance devices Z1-1, Z1-2, . . . , and Z1-16 and Z2-1, Z2-2, . . . , and Z2-16 are uniform, the phase characteristic of the output interpolation signal S3 will be the curve CC4, which tends to approach the first input signal S1 too much because the interpolation signal S3 is generated via voltage interpolation instead of ideal time interpolation. If the impedance values of the impedance devices Z1-1, Z1-2, . . . , and Z1-16 and Z2-1, Z2-2, . . . , and Z2-16 are non-uniform and arranged as shown in FIG. 6, the phase characteristic of the output interpolation signal S3 will be the curve CC3. In comparison, the arrangement of FIG. 6 effectively improves the signal linearity of the output interpolation signal S3.

Note that the effectiveness of the embodiments of FIGS. 4-7 may be also achieved by the embodiment of FIG. 2 by adjusting the transistor sizes of the interpolation cells. For example, an impedance device having a relatively smaller impedance value may be implemented with a transistor having a relatively larger transistor size. Similarly, an impedance device having a relatively larger impedance value may be implemented with a transistor having a relatively smaller transistor size.

Figure 8:
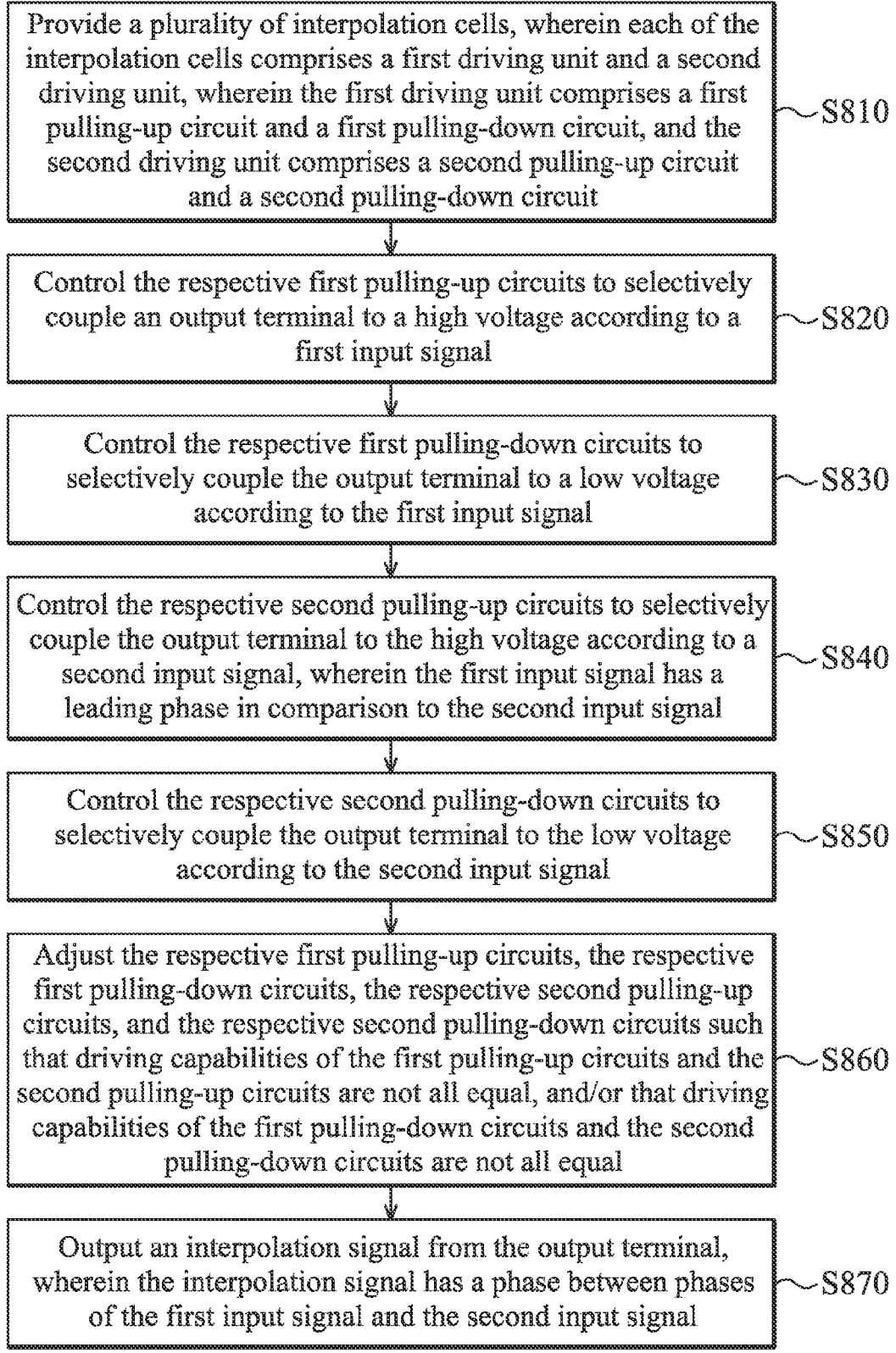
FIG. 8 is a flowchart for illustrating a method for interpolation according to an embodiment of the invention.

FIG. 8 is a flowchart for illustrating a method for interpolation according to an embodiment of the invention. To begin, in step S810, a plurality of interpolation cells are provided, wherein each of the interpolation cells comprises a first driving unit and a second driving unit, and the first driving unit comprises a first pulling-up circuit and a first pulling-down circuit, and the second driving unit comprises a second pulling-up circuit and a second pulling-down circuit. In step S820, the respective first pulling-up circuits are controlled to selectively couple an output terminal to a high voltage according to a first input signal. In step S830, the respective first pulling-down circuits are controlled to selectively couple the output terminal to a low voltage according to the first input signal. In step S840, the respective second pulling-up circuits are controlled to selectively couple the output terminal to the high voltage according to a second input signal, wherein the first input signal has a leading phase in comparison to the second input signal. In step S850, the respective second pulling-down circuits are controlled to selectively couple the output terminal to the low voltage according to the second input signal. In step S860, the respective first pulling-up circuits, the respective first pulling-down circuits, the respective second pulling-up circuits, and the respective second pulling-down circuits are configured such that driving capabilities of the first pulling-up circuits and the second pulling-up circuits are not all equal, and/or that driving capabilities of the first pulling-down circuits and the second pulling-down circuits are not all equal. Note that the configuration may be predetermined or adjustable after manufacturing (for example, using variable resistors). In step S870, an interpolation signal is output from the output terminal. The steps S810 to S870 may not be performed in order. Note that every feature of the embodiments of FIGS. 1-7 may be applied to the embodiment of FIG. 8.

The invention provides a novel interpolator and a method for interpolation. By appropriately adjusting non-uniform driving capabilities of interpolation cells, the invention can effectively solve the problem of signal nonlinearity during interpolation, and in addition, no complex circuits are required. The disclosed interpolators are suitable for clock data recovery (CDR) circuits, phase locked loop (PLL) circuits, etc.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An interpolator, comprising:
    a plurality of interpolation cells, each comprising:
    a first driving unit, comprising:
        a first pulling-up circuit, for selectively coupling an output terminal directly to a high voltage according to a first input signal, wherein the output terminal is used to output an interpolation signal;
        a first pulling-down circuit, for selectively coupling the output terminal directly to a low voltage according to the first input signal; and
        a pair of first switches, for selectively enabling the first pulling-up circuit and the first pulling-down circuit according to a control signal; and
    a second driving unit, comprising:
        a second pulling-up circuit, for selectively coupling the output terminal directly to the high voltage according to a second input signal;
        a second pulling-down circuit, for selectively coupling the output terminal directly to the low voltage according to the second input signal; and
        a pair of second switches, for selectively enabling the second pulling-up circuit and the second pulling-down circuit according to the control signal,
    wherein in all of the interpolation cells, driving capabilities of the first pulling-up circuits and the second pulling-up circuits are not all equal, and driving capabilities of the first pulling-down circuits and the second pulling-down circuits are not all equal;
    wherein in each of the interpolator cells, the first pulling-up circuit comprises a first impedance device, and the second pulling-up circuit comprises a second impedance device; and
    wherein in all of the interpolation cells, the first impedance devices and the second impedance devices are implemented with a plurality of resistors having non-uniform resistances, wherein each of the plurality of resistors is coupled directly to one of: the high voltage and the low voltage, and wherein the plurality of interpolation cells is arranged in the interpolator according to respective driving capabilities such that an interpolation cell having a highest driving capability is coupled closest to the output terminal.

2. The interpolator as claimed in claim 1, wherein in each of the interpolation cells, the first pulling-up circuit comprises a first transistor having a control terminal for receiving the first input signal, a first terminal coupled to the high voltage, and a second terminal coupled to the output terminal, and the second pulling-up circuit comprises a second transistor having a control terminal for receiving the second input signal, a first terminal coupled to the high voltage, and a second terminal coupled to the output terminal, and the first pulling-down circuit comprises a third transistor having a control terminal for receiving the first input signal, a first terminal coupled to the low voltage, and a second terminal coupled to the output terminal, and the second pulling-down circuit comprises a fourth transistor having a control terminal for receiving the second input signal, a first terminal coupled to the low voltage, and a second terminal coupled to the output terminal.

3. The interpolator as claimed in claim 2, wherein in all of the interpolation cells, transistor sizes of the first transistors are not all equal, transistor sizes of the second transistors are not all equal, transistor sizes of the third transistors are not all equal, and transistor sizes of the fourth transistors are not all equal.

4. The interpolator as claimed in claim 3, wherein the control signal controls the pairs of first switches to disable the first driving unit having a relatively smaller transistor size and enable the first driving unit having a relatively larger transistor size, and controls the pairs of second switches to enable the second driving unit having a relatively smaller transistor size and disable the second driving unit having a relatively larger transistor size when the interpolation signal with a relatively leading phase is desired.

5. The interpolator as claimed in claim 3, wherein the control signal controls the pairs of first switches to disable the first driving unit having a relatively larger transistor size and enable the first driving unit having a relatively smaller transistor size, and controls the pairs of second switches to enable the second driving unit having a relatively larger transistor size and disable the second driving unit having a relatively smaller transistor size when the interpolation signal with a relatively lagging phase is desired.

6. The interpolator as claimed in claim 1, wherein the control signal controls the pairs of first switches to disable the first driving unit having a relatively larger impedance value and enable the first driving unit having a relatively smaller impedance value, and controls the pairs of second switches to enable the second driving unit having a relatively larger impedance value and disable the second driving unit having a relatively smaller impedance value when the interpolation signal with a relatively leading phase is desired.

7. The interpolator as claimed in claim 1, wherein the control signal controls the pairs of first switches to disable the first driving unit having a relatively smaller impedance value and enable the first driving unit having a relatively larger impedance value, and controls the pairs of second switches to enable the second driving unit having a relatively smaller impedance value and disable the second driving unit having a relatively larger impedance value when the interpolation signal with a relatively lagging phase is desired.

8. The interpolator as claimed in claim 1, wherein in each of the interpolation cells, the first pulling-down circuit comprises a third impedance device, and the second pulling-down circuit comprises a fourth impedance device.

9. The interpolator as claimed in claim 8, wherein in all of the interpolation cells, impedance values of the third impedance devices are not all equal, and impedance values of the fourth impedance devices are not all equal.

10. The interpolator as claimed in claim 9, wherein the control signal controls the pairs of first switches to disable the first driving unit having a relatively larger impedance value and enable the first driving unit having a relatively smaller impedance value, and controls the pairs of second switches to enable the second driving unit having a relatively larger impedance value and disable the second driving unit having a relatively smaller impedance value when the interpolation signal with a relatively leading phase is desired.

11. The interpolator as claimed in claim 9, wherein the control signal controls the pairs of first switches to disable the first driving unit having a relatively smaller impedance value and enable the first driving unit having a relatively larger impedance value, and controls the pairs of second switches to enable the second driving unit having a relatively smaller impedance value and disable the second driving unit having a relatively larger impedance value when the interpolation signal with a relatively lagging phase is desired.

12. The interpolator as claimed in claim 1, wherein based on the driving capabilities of the first and second pulling-up circuits and the first and second pulling-down circuits, the control signal controls the respective pairs of first switches and the respective pairs of second switches to selectively enable the respective first pulling-up circuits, the respective first pulling-down circuits, the respective second pulling-up circuits, and the respective second pulling-down circuits.

13. The interpolator as claimed in claim 1, wherein the control signal controls the pairs of first switches to disable the first driving unit having a relatively poorer driving capability and enable the first driving unit having a relatively stronger driving capability, and controls the pairs of second switches to enable the second driving unit having a relatively poorer driving capability and disable the second driving unit having a relatively stronger driving capability when the interpolation signal with a relatively leading phase is desired.

14. The interpolator as claimed in claim 1, wherein the control signal controls the pairs of first switches to enable the first driving unit having a relatively poorer driving capability and disable the first driving unit having a relatively stronger driving capability, and controls the pairs of second switches to disable the second driving unit having a relatively poorer driving capability and enable the second driving unit having a relatively stronger driving capability when the interpolation signal with a relatively lagging phase is desired.

15. The interpolator as claimed in claim 1, wherein in each of the interpolator cells, when one of the first driving unit and the second driving unit is enabled, another of the first driving unit and the second driving unit is disabled.

16. A method for interpolation, comprising the steps of:
providing a plurality of interpolation cells, wherein each of the interpolation cells comprises a first driving unit and a second driving unit, wherein the first driving unit comprises a first pulling-up circuit and a first pulling-down circuit, and the second driving unit comprises a second pulling-up circuit and a second pulling-down circuit;
controlling the respective first pulling-up circuits to selectively couple an output terminal directly to a high voltage according to a first input signal;
controlling the respective first pulling-down circuits to selectively couple the output terminal directly to a low voltage according to the first input signal;

controlling the respective second pulling-up circuits to selectively couple the output terminal directly to the high voltage according to a second input signal, wherein the first input signal has a leading phase in comparison to the second input signal;

controlling the respective second pulling-down circuits to selectively couple the output terminal directly to the low voltage according to the second input signal;

configuring the respective first pulling-up circuits, the respective first pulling-down circuits, the respective second pulling-up circuits, and the respective second pulling-down circuits such that driving capabilities of the first pulling-up circuits and the second pulling-up circuits are not all equal, and that driving capabilities of the first pulling-down circuits and the second pulling-down circuits are not all equal; and outputting an interpolation signal from the output terminal;

wherein in each of the interpolator cells, the first pulling-up circuit comprises a first impedance device, and the second pulling-up circuit comprises a second impedance device; and wherein in all of the interpolation cells, the first impedance devices and the second impedance devices are implemented with a plurality of resistors having non-uniform resistances, wherein each of the plurality of resistors is coupled directly to one of: the high voltage and the low voltage, and wherein the plurality of interpolation cells is arranged in the interpolator according to respective driving capabilities such that an interpolation cell having a highest driving capability is coupled closest to the output terminal.

* * * * *